(12) United States Patent
Young et al.

(10) Patent No.: US 6,495,312 B1
(45) Date of Patent: Dec. 17, 2002

(54) METHOD AND APPARATUS FOR REMOVING PHOTORESIST EDGE BEADS FROM THIN FILM SUBSTRATES

(75) Inventors: Roger Y. B. Young, Vancouver, WA (US); Bruce Whitefield, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/879,642

(22) Filed: Jun. 12, 2001

Related U.S. Application Data

(63) Continuation of application No. 09/775,223, filed on Feb. 1, 2001, now abandoned.

(51) Int. Cl.[7] .............................. G03F 7/22; G03F 7/24; G03F 7/40; G03F 7/42
(52) U.S. Cl. ........................ 430/328; 430/326; 430/329
(58) Field of Search ................................ 430/329, 326, 430/328

(56) References Cited

U.S. PATENT DOCUMENTS 6,239,035 B1 * 5/2001 Harris ........................ 438/703

FOREIGN PATENT DOCUMENTS

| JP | 2-237018 | * | 9/1990 |
| WO | WO 200182001 | * | 11/2001 |

OTHER PUBLICATIONS

Research Disclosure No. 331028, Nov. 1991.*

* cited by examiner

*Primary Examiner*—Richard L. Schilling
(74) *Attorney, Agent, or Firm*—Westman, Champlin & Kelly

(57) ABSTRACT

A positive photoresist bead is removed from an edge surface of a substrate by exposing the photoresist bead with light from an exposing source along a plurality of non-parallel paths approximately normal to the surface of the photoresist bead. The light may be simultaneously directed by a light guide along the non-parallel paths, or a mount may support the light guide adjacent the bead to move the light guide to various positions to direct the light along the non-parallel paths. Alternatively, plural light sources direct light to the bead along non-parallel paths. In any case, the exposed photoresist bead is then removed with a solvent.

11 Claims, 4 Drawing Sheets

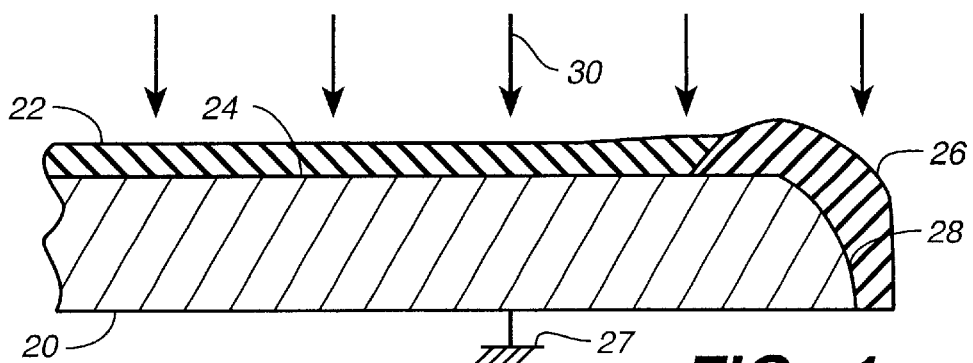
FIG._1
(PRIOR ART)
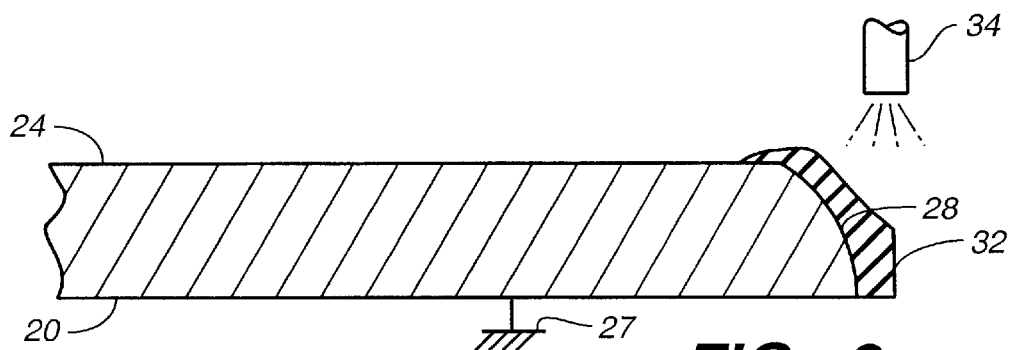
FIG._2
(PRIOR ART)
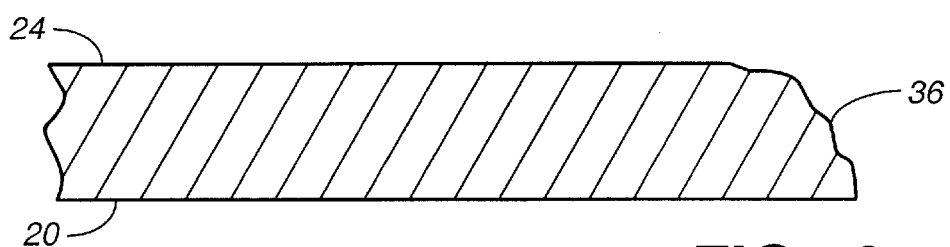
FIG._3
(PRIOR ART)

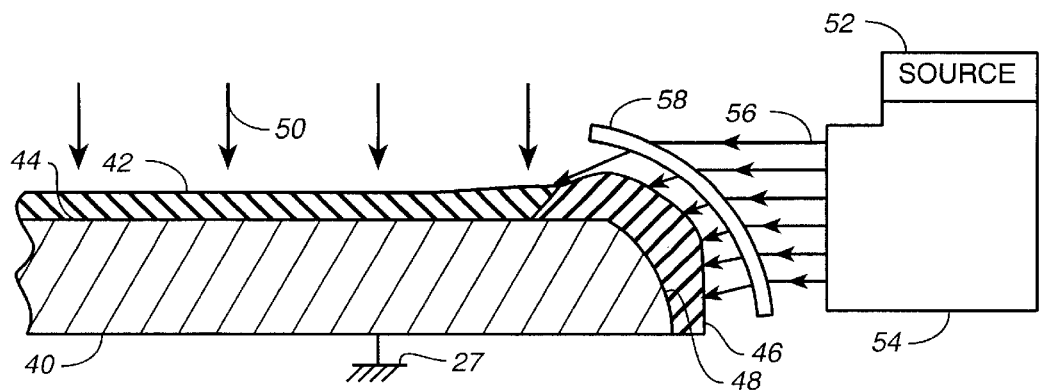
FIG._4
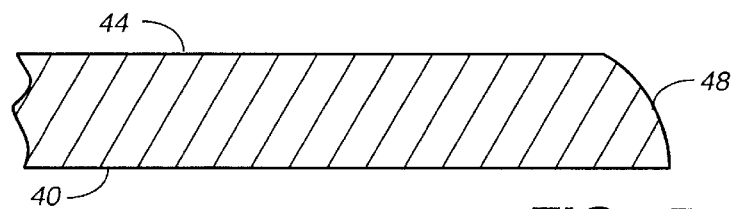
FIG._5
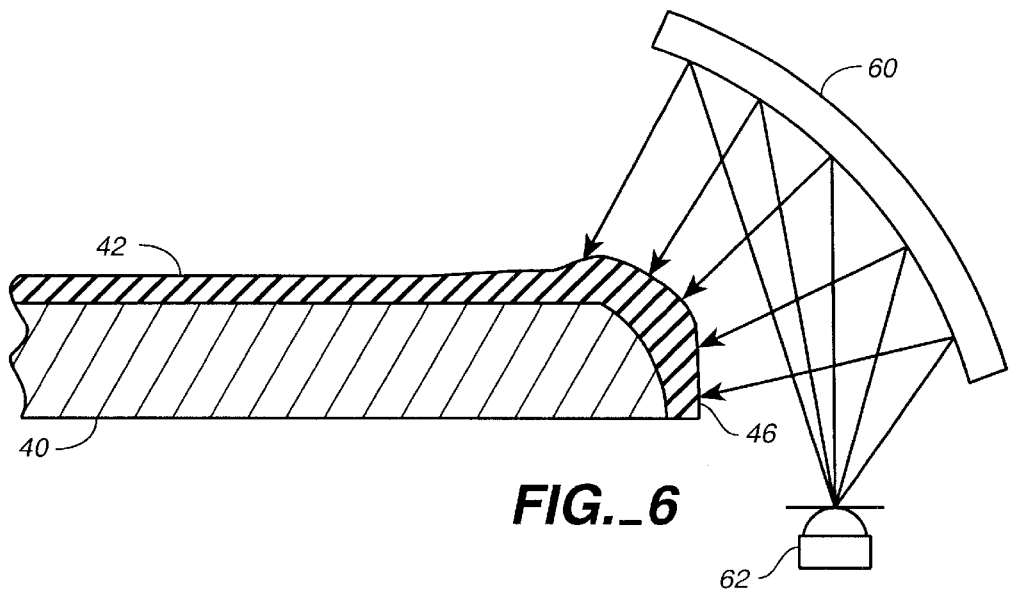
FIG._6

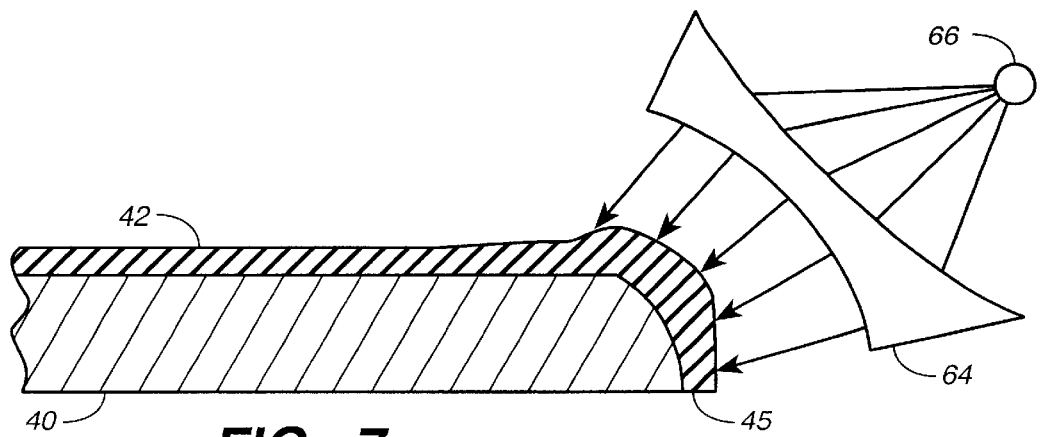
FIG._7
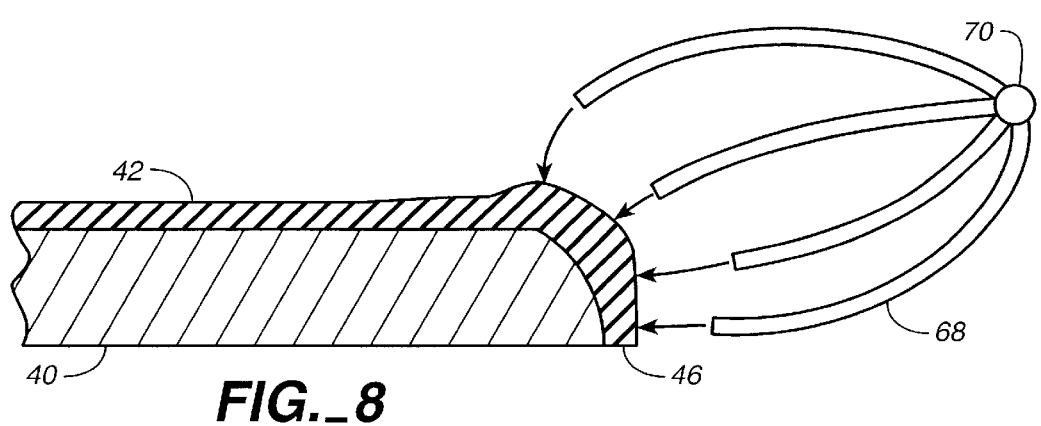
FIG._8
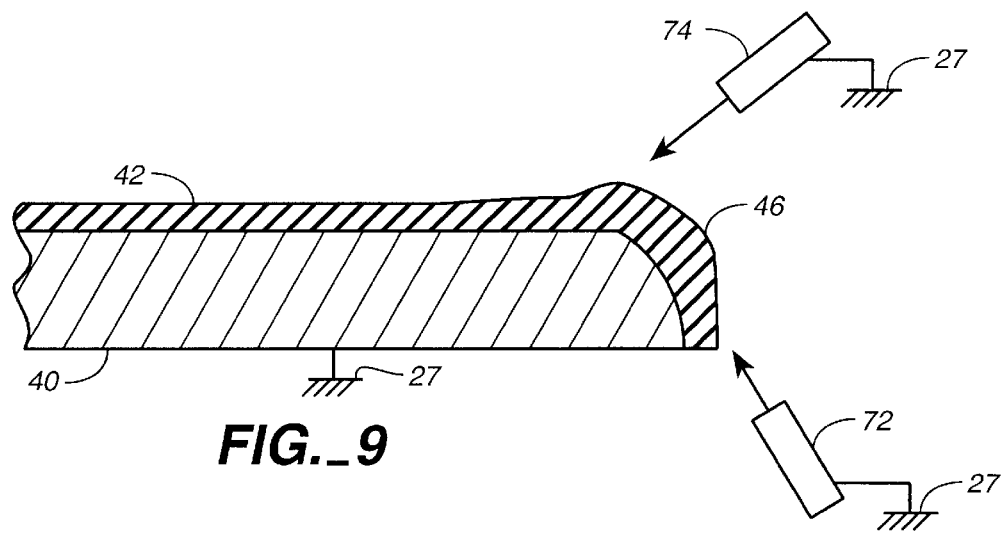
FIG._9

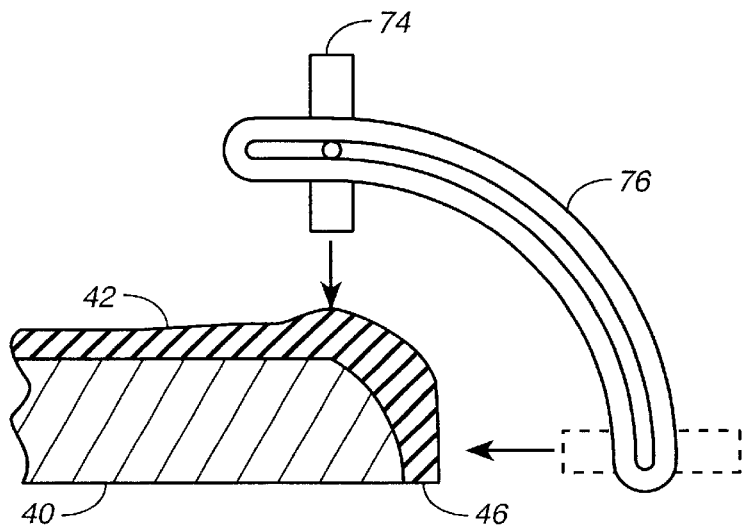
FIG._10
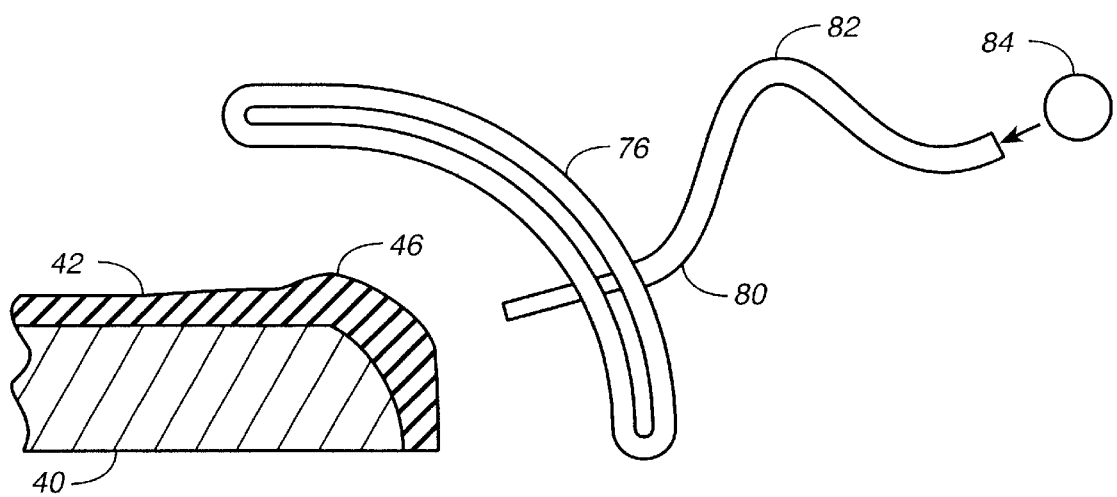
FIG._11

METHOD AND APPARATUS FOR REMOVING PHOTORESIST EDGE BEADS FROM THIN FILM SUBSTRATES

CROSS-REFERENCE TO RELATED APPLICATION

This application is a continuation of application Ser. No. 09/775,223 filed Feb. 1, 2001 now abandoned.

FIELD OF THE INVENTION

This invention relates to the removal of beads of photoresist at the edges of beveled wafers or substrates, and particularly to a method and apparatus removing such edge beads formed of positive photoresist.

BACKGROUND OF THE INVENTION

Photoresists are used to form masks on wafers and other substrates used in photolithographic processes. The photoresist is typically applied to the substrate in an even coat of substantially uniform thickness by any of several well-known processes, including deposition and spreading the photoresist in a squeegee-like manner across the surface of the substrate. Selected regions of the photoresist are then exposed to light through a photographic mask to develop the exposed regions of the photoresist. The photographic mask is removed, and a base solvent is applied to the photoresist to wash away certain regions of the photoresist. More particularly, in the case of a positive photoresist, the exposed, or developed, portions of the photoresist are washed away with a solvent. Conversely, unexposed, or undeveloped, portions of negative photoresists are washed away with solvents. In either case, the remaining portions of the photoresist form photolithographic masks on the substrate so that additional material(s) may be applied to the exposed portions of the substrate. In some applications, the photoresist may remain in the structure being formed. In other cases, the mask formed by the photoresist may be removed with a solvent, often carrying with it any unwanted materials on the photoresist that were deposited onto the substrate and photoresist during processes subsequent to the formation of the photoresist mask.

One problem in connection with fabrication of substrates employing photoresists resides in the formation of edge beads along the edges, including the back and front edges, of the substrate. Where the substrate has a beveled angle at the edge, the thickness of the photoresist in a direction normal to the top surface of the substrate is greater at the edge than in other regions. The thicker edge beads may create problems during subsequent processing of the substrate. Consequently, it is desirable to remove the photoresist edge bead from the edges of these substrates.

Traditionally, a solvent was employed to remove the edge bead, but due to the varying thickness of the edge bead, the amount of solvent employed could not be accurately controlled, thereby leading to ineffective removal of the edge bead photoresist, or damage to the substrate, or both. Positive photoresists presented the additional problem that because the edge bead consisted of largely unexposed photoresist, a strong solvent such as Ethyl Lactate, was required to dissolve the excess photoresist. However, this solvent often created defects at the beveled edge of the substrate. Moreover, the uncontrolled thickness of the edge bead in the processing direction normal to the top surface of the substrate often resulted in inadequate removal of the edge bead.

Edge exposure systems have been used to expose photoresist edge beads from substrates so that the beads can be removed by the develop solvent. However, these edge exposure systems exposed the bead from the top or working surface of the substrate where the edge bead is thickest, leaving unexposed photoresist on the edges of the substrate. Consequently, the solvent was ineffective to remove the edge bead.

SUMMARY OF THE INVENTION

The present invention is directed to removal of positive photoresist edge beads by directing light to the edge beads at an angle to the substrate to thereby more effectively expose the positive photoresist edge beads, allowing ready removal.

In accordance with one aspect of the present invention, a light source is provided to develop the photoresist edge bead. Apparatus directs a beam of light from the light source to the photoresist bead along a plurality of non-parallel paths approximately normal to an irregular surface of the photoresist bead.

In some forms of the invention, the apparatus directing light includes a light guide that directing light from the light source to the edge of the substrate along the plurality of paths. In various embodiments, the light guide includes light reflectors, light transmitters, lenses, and fiber optic cables. In various other embodiments, the light guide is supported on a mount that moves the light guide to various positions relative to the edge bead to direct light along a respective path for each position.

In other forms of the invention, a plurality of light sources may be employed to direct exposing light from various angles to the edge bead.

In accordance with another aspect of the invention, a positive photoresist bead is removed from an edge surface of a substrate. The photoresist bead is exposed with light along a plurality of non-parallel paths approximately normal to the surface of the photoresist bead. The exposed photoresist bead is then removed, such as with a solvent or the like.

BRIEF DESCRIPTION OF THE DRAWINGS

FIG. 1 is a section view of a substrate having a photoresist and edge bead thereon, illustrating the manner of exposure to light in prior techniques.

FIG. 2 illustrates application of solvent to the edge bead in prior techniques.

FIG. 3 is a section view of the substrate showing defects or damage due to the solvent due to prior techniques.

FIG. 4 is a section view of a substrate having light applied to the edge bead in accordance with the first embodiment of the present invention.

FIG. 5 illustrates the completed substrate as a result of the invention of FIG. 4.

FIGS. 6–11 illustrate second, third, fourth, fifth, sixth and seventh embodiments, respectively, of the apparatus for applying light to the edge bead of a substrate.

DETAILED DESCRIPTION OF THE PREFERRED EMBODIMENTS

FIG. 1 illustrates a substrate 20 having a layer of photoresist 22 of substantially even thickness on a surface 24 thereon. During processing of substrate 20, the bottom surface 25 is typically positioned on a stand 27, and all processing is directed at the substrate in a direction normal to surfaces 24 and 25. Also during processing, an edge bead 26 of photoresist is formed over the beveled edge 28 of substrate 20. Formation of the edge bead 26 of photoresist occurs at the edge in any of several ways, such as build up during deposition of photoresist during plural deposition steps, build up of photoresist during a squeegee or spin coating process, etc. Edge bead 26 is generally arcuate, following the contour of the surface of edge 28 of substrate 20, but has an incrementally irregular surface due to irregular build up of photoresist. The irregular surface of edge bead 26 extends between a plane generally parallel to surface 24 and a plane generally parallel to edge 28 where it meets lower surface 25 (generally normal, or perpendicular, to surface 24).

Photoresist 20,26 is a positive photoresist. When exposed to ultraviolet (UV) light, photoresist 20,26 is chemically altered to allow dissolving by a weak solvent, such as ammonium hydroxide or sodium hydroxide. Consequently, the solvent allows removal of unwanted photoresist, thereby forming the photolithograph mask or other structure. In prior techniques, the ultraviolet light 30 was usually applied through a photographic mask in a direction normal to surface 24 of the substrate, and hence normal to the top surface of the photoresist. The light was usually polarized or columnar so that light did not expose portions of the photoresist under the photographic mask. However, the thicker photoresist at the edge bead of the beveled edge 28 of substrate 20 was not adequately exposed by UV light 30, requiring, as shown in FIG. 2, application of a stronger solvent 34, such as ethyl lactate, to the remaining portion 32 of edge bead 26 to dissolve the edge bead. More particularly, the edge bead is significantly thicker in the direction parallel to light 30 than other portions 22 of the photoresist, and therefore was not as easily exposed. As shown in FIG. 1, the edge bead often was thicker, in the direction of processing normal to surface 24, than the sum of the thicknesses of substrate 20 photoresist layer 22. Moreover, the thickness of the edge bead 26 on beveled edge 28 typically varies, and is indeterminate. Consequently, solvent 34 often etched into the edge 36 of the substrate, as shown in FIG. 3, or was inadequate to fully dissolve the photoresist, thereby leaving unexposed photoresist on the edge, or both.

FIG. 4 illustrates the process and apparatus of a first embodiment of the present invention for removing the edge bead from the edge of substrate 40. Substrate 40 includes a layer of photoresist 42 on top surface 44 forming an edge bead 46 over the beveled edge 48. Columnar or polarized UV light 50 is applied to the photoresist 42 on the top surface of substrate 40 to fully expose exposed portions of photoresist 42 in the manner well known in the art. According to the present invention, UV light from source 52 is also applied in a direction approximately normal to the surface of the edge bead. More particularly, the edge bead has an irregular surface that approximately follows the contour of the edge 48. The UV light from source 52 is directed along a plurality of non-parallel paths to bead 46 to thereby impinge the bead from different directions approximately normal to the irregular surface of the bead. Consequently, rather than confronting the thickness of the edge bead photoresist in a direction parallel to beam 50, as in prior techniques, the present invention directs UV light along a direction where the edge bead is thinnest. Consequently, the present invention employs light transmission apparatus to direct the light along plural non-parallel paths at acute angles to the working surface 44 of the substrate to impinge substantially normal to the irregular surface of the bead.

In the embodiment of FIG. 4, light 50 is a directed from source 52 through waveguide 54 to the edge portion of the substrate, normal to the direction of light directed to layer 42. Light transmission element 58 directs the light substantially normal to the surface of edge bead 46 to fully expose the photoresist of the edge bead 46 to ultraviolet light. Subsequently, when washed with the weak solvent, such as ammonium hydroxide or sodium hydroxide, edge bead 46 and photoresist layer 42 are effectively removed, leaving the undamaged substrate 40 illustrated in FIG. 5.

Various techniques may be employed to direct light at an angle to the top surface 42 of the substrate. Thus, FIG. 6 illustrates a reflective member 60 and a fixedly mounted light source 62 arranged to reflect light at various incident angles to edge bead 46. In FIG. 7, a lens 64 focuses light from light source 66 to direct light to edge bead 46 at various angles. In FIG. 8, a plurality of fiber optic transmission lines 68 direct light from source 70 to edge bead 46. In FIG. 9, a plurality of independent light sources 72 and 74 are supported by stand 27 to direct light at edge bead 46 from different angles.

In FIGS. 10 and 11, single light source is mounted to a bracket 76 and movable by bracket 76 to direct light from various positions to edge bead 46. Thus, in FIG. 10, a light source 78 is mounted to bracket 76 and movable in an arc defined by bracket 76 around the sides of edge bead 46. In FIG. 11, fiber optic transmission cable 80 is fastened to bracket 76 to direct light from source 84 to edge bead 46 at various angles. Cable 80 is positioned by bracket 76 and includes a flexible loop 82 to allow movement of the cable.

The present invention thus provides an effective technique to direct ultraviolet light at the edge bead of the substrate in a photolithographic process to allow the edge bead to be removed with a weak solvent such as sodium hydroxide or ammonium hydroxide. Consequently, the present invention permits edge bead removal without risk of damage to the substrate edge, as in prior techniques. The invention is effective in use and is economical since expensive chemical solvents may be eliminated, or at least reduced.

Although the present invention has been described with reference to preferred embodiments, workers skilled in the art will recognize that changes may be made in form and detail without departing from the spirit and scope of the invention.

What is claimed is:

1. A process for removing a positive photoresist bead from an edge surface of a substrate comprising steps of:
   a) exposing the photoresist bead with light along a plurality of non-parallel paths approximately normal to the surface of the photoresist bead; and
   b) removing the exposed photoresist bead.

2. The process of claim 1, wherein light is transmitted simultaneously along the plural paths.

3. The process of claim 2, wherein the plural paths are defined by a light transmitter.

4. The process of claim 3, wherein the light transmitter comprises a plurality of light cables.

5. The process of claim 2, wherein the plural paths are defined by a lens.

6. The process of claim 2, wherein the plural paths are defined by a reflector.

7. The process of claim 1, wherein the plural paths are defined by moving a light transmitter to a plurality of positions, the light transmitter directing light to the edge bead along a respective path for each of the plurality of positions.

8. The process of claim 7, wherein the light transmitter includes the light source.

9. The process of claim 7, wherein the light transmitter includes a light cable.

10. The process of claim 1, wherein step (a) is performed by:
   a1) providing a source of light,
   a2) directing light from the source in a plurality of directions to the edge bead.

11. The process of claim 1, wherein step (a) is performed by:
   (a1) providing a plurality of sources of light, and
   (a2) directing light from each of the sources along a separate path to the edge bead.

* * * * *